(12) United States Patent
Pfuch et al.

(10) Patent No.: US 8,883,256 B2
(45) Date of Patent: *Nov. 11, 2014

(54) PROCESS FOR THE INTERNAL COATING OF HOLLOW BODIES USING A PLASMA BEAM AT ATMOSPHERIC PRESSURE

(75) Inventors: Andreas Pfuch, Apolda (DE); Michael Droessler, Gehrden (DE); Kerstin Horn, Jena (DE); Andreas Heft, Gera (DE)

(73) Assignee: Innovent E.V., Jena (DE)

( * ) Notice: Subject to any disclaimer, the term of this patent is extended or adjusted under 35 U.S.C. 154(b) by 275 days.

This patent is subject to a terminal disclaimer.

(21) Appl. No.: 13/054,774

(22) PCT Filed: Jul. 7, 2009

(86) PCT No.: PCT/EP2009/058549

§ 371 (c)(1),
(2), (4) Date: Apr. 8, 2011

(87) PCT Pub. No.: WO2010/006951

PCT Pub. Date: Jan. 21, 2010

(65) Prior Publication Data

US 2011/0189407 A1      Aug. 4, 2011

(30) Foreign Application Priority Data

Jul. 18, 2008 (DE) .......................... 10 2008 033 939

(51) Int. Cl.
| | |
|---|---|
| *C23C 16/50* | (2006.01) |
| *C23C 16/34* | (2006.01) |
| *C23C 16/40* | (2006.01) |
| *B82Y 30/00* | (2011.01) |
| *C23C 16/04* | (2006.01) |
| *C23C 16/44* | (2006.01) |
| *C23C 16/02* | (2006.01) |
| *C23C 16/513* | (2006.01) |
| *C23C 16/06* | (2006.01) |

(52) U.S. Cl.
CPC ............. *C23C 16/513* (2013.01); *C23C 16/045* (2013.01); *C23C 16/34* (2013.01); *C23C 16/44* (2013.01); *C23C 16/40* (2013.01); *C23C 16/02* (2013.01); *C23C 16/06* (2013.01); *Y10S 977/773* (2013.01); *Y10S 977/777* (2013.01); *Y10S 977/81* (2013.01); *Y10S 977/902* (2013.01)
USPC ........... 427/237; 427/231; 977/773; 977/777; 977/810; 977/902

(58) Field of Classification Search
None
See application file for complete search history.

(56) References Cited

U.S. PATENT DOCUMENTS

| | | | | |
|---|---|---|---|---|
| 4,292,342 | A | * | 9/1981 | Sarma et al. ..................... 264/81 |
| 2002/0058143 | A1 | | 5/2002 | Hunt et al. |
| 2003/0215644 | A1 | | 11/2003 | Deshpande et al. |
| 2004/0173316 | A1 | * | 9/2004 | Carr ......................... 156/345.41 |

FOREIGN PATENT DOCUMENTS

| | | |
|---|---|---|
| DE | 197 26 443 A1 | 3/1999 |
| DE | 10 2005 040 266 A1 | 3/2007 |
| DE | 10 2006 012 021 A1 | 9/2007 |
| JP | 4-124273 | 4/1992 |
| WO | WO 01/055489 A * | 8/2001 |
| WO | WO 01/55489 A2 | 8/2001 |
| WO | WO 02/071438 A * | 9/2002 |
| WO | WO 02/071438 A2 | 9/2002 |
| WO | WO 2006/048649 A1 | 5/2006 |
| WO | WO 2006/096255 A * | 9/2006 |
| WO | WO 2006/096255 A2 | 9/2006 |
| WO | WO 2007/022976 A * | 3/2007 |
| WO | WO 2007/022976 A2 | 3/2007 |
| WO | WO 2009/128880 A1 | 10/2009 |

* cited by examiner

Primary Examiner — William Phillip Fletcher, III
(74) Attorney, Agent, or Firm — Muncy, Geissler, Olds & Lowe, P.C.

(57) ABSTRACT

A coating method for the internal coating of a hollow body which includes producing a plasma jet from a working gas, supplying at least one precursor material to the working gas and/or to the plasma jet, introducing the plasma jet through a first opening into an interior of the hollow body and depositing at least one reaction product of at least one precursor on an inner surface of the hollow body and/or on at least one layer arranged on the inner surface. The method is carried out at atmospheric pressure. Furthermore, the first internal coating takes place without an activation process directly after a production process of the hollow body, in which the hollow body is formed with the supply of heat.

27 Claims, 1 Drawing Sheet

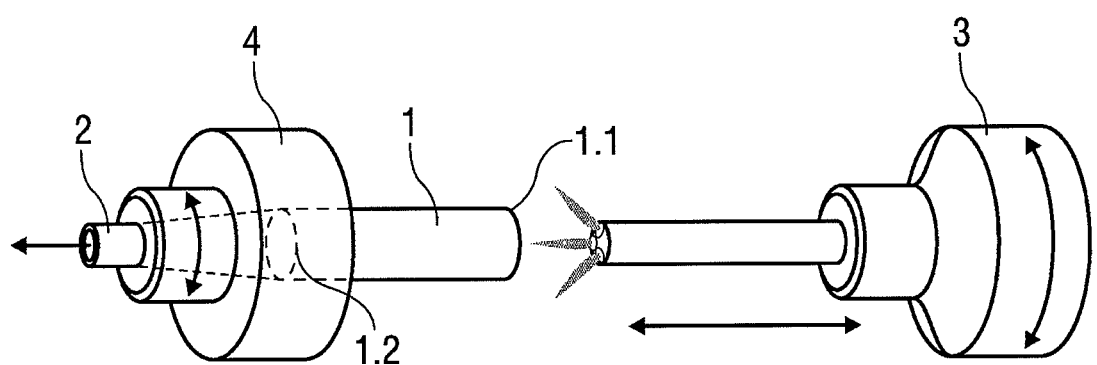

PROCESS FOR THE INTERNAL COATING OF HOLLOW BODIES USING A PLASMA BEAM AT ATMOSPHERIC PRESSURE

This application is a national stage of International Application No.: PCT/EP2009/058549, which was filed on Jul. 7, 2009, and which claims priority to German Patent Application No.: 10 2008 033 393.3, which was filed in Germany on Jul. 18, 2008, and which are both herein incorporated by reference.

BACKGROUND OF THE INVENTION

1. Field of the Invention

The invention relates to a process for the internal coating of a hollow body.

2. Description of the Background Art

The coating of surfaces with thin functional layers, particularly within the nanometer range, with use of a plasma has been known for a long time. Different gas discharges under vacuum conditions are used in this regard. A distinction is made between physical and chemical vapor deposition.

The internal coating of tube material by plasma-assisted chemical vapor deposition represents a special challenge.

DE 10 2005 040 266 A1, which corresponds to U.S. Publication No. 20090155490, and which discloses a method for the internal coating of hollow bodies, in which a treatment area in a reactor chamber is evacuated at least partially, a process gas is introduced into the treatment area, particularly into the hollow body, and by means of radiated electromagnetic energy a plasma is ignited in the process gas introduced into the treatment area. In so doing, during the plasma treatment the process gas flows through the treatment area between opposite ends.

U.S. Pat. App. No. 2002/0058143 A1 discloses a combustion-based method for chemical vapor deposition (CCVD), in which the interior of a hollow body is coated by insertion of a flame burner.

A method for the internal coating of a hollow endless geometry is known from DE 10 2006 012 021 A1, which corresponds to U.S. Publication No. 2009092763, whereby a gas mixture containing at least one precursor is introduced into the endless geometry, whereby the endless geometry is passed through at least one electrode unit, whereby an alternating electric voltage is applied to the electrode unit, whereby the gas mixture is transformed at least partially to the plasma state in the area of the electrode unit, and whereby a reaction product is produced from the precursor by the plasma and deposited on the inner surface.

U.S. Pat. App. No. 2003/0215644 A1 discloses a method in which finely divided aerosols of polymer solutions are applied to a substrate, an energy source being applied simultaneously to the solution.

A CVD method is known from Japanese Pat. App. No. JP 04124273 A, in which the interior of a tube is evacuated and a carrier gas with gaseous raw materials is introduced. A plasma is generated by arc discharge and passed through the interior of the tube by central/axial guidance by means of magnetic field arrangements for the purpose of CVD deposition.

DE 197 26 443 A1, which corresponds to U.S. Pat. No. 6,129,856, and which discloses a method for surface-finishing inner surfaces of hollow bodies with at least one opening, said method in which the hollow body is finished from inside by a hollow-cathode glow discharge as the excitation source, and a gas stream flowing through the hollow body extracts particles from a plasma forming during the hollow-cathode glow discharge, excites them, and transports them to the inner surface of the hollow body where they initiate the finishing process, whereby the hollow body is disposed in a vacuum vessel, and the hollow body and the hollow cathode form elements separate from one another.

SUMMARY OF THE INVENTION

The object of the invention is to provide an improved method for the internal coating of hollow bodies.

In a method of the invention for the internal coating of a hollow body, a plasma jet is produced from a working gas. In so doing, at least one precursor material is supplied to the working gas and/or to the plasma jet and caused to react in the plasma jet. This causes deposition of at least one reaction product of at least one precursor on an inner surface of the hollow body and/or on at least one layer arranged on an inner surface. The method of the invention is carried out at atmospheric pressure, whereby the plasma jet is introduced through a first opening of the hollow body.

In an embodiment, the plasma jet is removed by suction through a second opening of the hollow body. The plasma jet can be passed through the entire hollow body with removal by suction at the second opening of the hollow body, which enables an especially homogeneous activation or coating in the longitudinal direction of the hollow body.

By working at atmospheric pressure, a time-consuming process step of the evacuation of a process chamber and apparatus for the generation of vacuum, such as vacuum pumps and process chambers, are omitted in an especially advantageous manner. As a result, the method of the invention can be integrated without great effort into a process chain, which comprises production and finishing of the hollow body. It is possible to realize this type of coating with a plasma burner with low power consumption (for example, 100 W to 200 W).

Preferably, an activation process in which the plasma jet is introduced into the hollow body without a precursor material being supplied takes place before a coating process. As a result, the inner surface of the hollow body is cleaned and activated, leading to a better adhesion of the subsequently applied layers.

Furthermore, the first internal coating can take place directly after a production process of the hollow body, in which the hollow body was formed with the supplying of heat. As a result, the activation step can be avoided.

In an advantageous manner, the hollow body rotates around a longitudinal axis during the coating process, to achieve a homogeneous activation or coating of the inner surface of the hollow body.

The homogeneity of the activation or coating can also be achieved by rotation of a plasma burner.

Preferably, an outer electrode of the plasma burner is designed in such a way that it can be inserted through the first opening in the direction of the longitudinal axis of the hollow body.

The coating process comprises one or more coating passes in which the outer electrode of the plasma burner is inserted preferably in the hollow body and moved in the longitudinal direction thereof, so that the hollow body is coated from the inside once or repeatedly in succession.

Using this coating process, hollow bodies made of one of the substances: glass, plastic, metal, and ceramic, particularly syringe bodies made of glass, can be coated.

In the case of hollow bodies made of glass, it is possible using the method to deposit $SiO_2$ layers in the interior of the glass hollow body and thereby to reduce significantly alkali diffusion from the glass into a filling medium, for example, double-distilled water, present in the hollow body during the use of the hollow body.

A temperature of the hollow body in this coating process is within a range of 20° C. to 200° C., preferably within a range of 20° C. to 120° C., especially preferably within a range of 20° C. to 80° C.

For example, at least one oxide and/or a nitride and/or an oxynitride of at least one of the elements: silicon, titanium, aluminum, molybdenum, tungsten, vanadium, zirconium, or boron, can be deposited in the layer with use of the method. Preferably, organosilicon, organotitanium, and/or organoaluminum compounds are used as precursors for the deposition of silicon, titanium, and/or aluminum oxide layers. Such layers are especially suitable as barrier protection layers or scratch protection layers.

These precursors can be present in solid, liquid, and/or gaseous form, whereby solid and liquid precursors are expediently transformed to the gaseous state before introduction into the working gas or the plasma jet.

Preferably, silver-containing nanoparticles and/or silver as nanoparticles can be a component of a precursor. In this way, for example, $SiO_2$ layers with silver-containing nanoparticles can be formed with which it is possible to realize a bactericidal layer.

A throughput of the working gas and/or of the precursor is preferably variable and controllable and/or adjustable.

Furthermore, the speed with which the plasma burner can be inserted and moved in the hollow body, can be variable and controllable and/or adjustable. Therefore, apart from the throughput of the working gas and/or the precursor, there is another means available to influence the layer properties such as, for example, the layer thickness. The following properties of the substrate, for example, can be changed selectively by suitable selection of these process parameters and the employed precursors: scratch resistance, self-healing ability, reflection behavior, transmission behavior, refractive index, transparency, light scattering, electrical conductivity, friction, adhesion, hydrophilicity, hydrophobicity, oleophilicity, oleophobicity, surface tension, surface energy, anticorrosive action, dirt-repellent action, self-cleaning ability, photocatalytic behavior, antistress behavior, wear behavior, chemical resistance, biocidal behavior, biocompatible behavior, antibacterial behavior, electrostatic behavior, electrochromic activity, photochromic activity, and gasochromic activity.

Especially preferably, at least one of the deposited layers is made as a diffusion barrier to at least one alkali element, for example, sodium or potassium, and/or to at least one alkaline earth element, for example, magnesium or calcium, and/or to boron and/or particularly to tungsten.

During the production of glass syringe bodies, a tungsten punch creates the outlet opening of the syringe, after which tungsten and tungsten oxide remain on the still hot surface of the interior region of the outlet opening. These depositions of foreign substances are undesirable because of interactions with medications and can be prevented from entering the filling medium of the syringe body, for example, by a diffusion barrier, in order not to exceed the pharmaceutically established maximum concentrations of tungsten in the filling material.

The method is not limited to the coating of syringe bodies, however. Rather, it can also be used for other hollow bodies, particularly tubes and other continuous materials of any size, for example, for pipelines.

Furthermore, at least one of the deposited layers represents a diffusion barrier to at least one of the substances: oxygen, water, water vapor, and/or organic solvents, particularly from plastics.

In an embodiment of the invention, at least one gradient layer is applied to the inner side of the hollow body. A gradient layer should be understood to be a layer whose composition changes gradually across its thickness. The term is used in contrast to adjacent layers with different properties, which have a clear boundary.

A gas or aerosol, preferably air, oxygen, nitrogen, noble gases, hydrogen, carbon dioxide, gaseous hydrocarbons, ammonia, or a mixture of at least two of the aforementioned gases can be used as the working gas. Ammonia is suitable, for example, for the formation of nitrides and can have a catalytic action during the reaction of the precursor.

The ignition of the plasma can occur, for example, by means of high-frequency excitation inductively or capacitively or by means of microwave radiation.

A device for carrying out the method comprises a plasma burner, which is inserted in a first opening in the longitudinal direction of the hollow body. Furthermore, the device of the invention comprises a suction device, which is connected to a second opening of the hollow body, whereby a plasma is introduced through the first opening of the hollow body at atmospheric pressure and removed by suction through the second opening of the hollow body.

In an embodiment of the invention, the plasma burner and/or the hollow body are arranged rotatable.

Furthermore, the plasma burner is arranged movable in the direction of the longitudinal axis of the hollow body and insertable into the hollow body, whereby a rate of advance can be set.

According to another embodiment, a constant or variable rate of advance can be set for each coating pass.

According to another embodiment, the gas flow can be set depending on the rate of advance of the plasma burner and/or depending on the position of the plasma burner.

To assess the quality of the deposited layer, before the actual functional layer a marker layer can be deposited, which contains a marker substance that can be excited by irradiation with light, to reach a conclusion on the homogeneity of the functional layer lying over the marker layer from the light distribution of the marker substance. The marker substance can also be a component of the functional layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will become more fully understood from the detailed description given hereinbelow and the accompanying drawing which is given by way of illustration only, and thus, are not limitive of the present invention, and wherein:

FIG. 1 is a schematic illustration of a device for the internal coating of a hollow body by means of a plasma burner.

DETAILED DESCRIPTION

FIG. 1 shows schematically a device for the internal coating of a hollow body 1 with a suction device 2 and a plasma burner 3. Plasma burner 3 is inserted in a first opening 1.1 in the longitudinal direction of hollow body 1. Suction device 2 is connected to a second opening 1.2 of hollow body 1. In so doing, a plasma is introduced through the first opening 1.1 of hollow body 1 at atmospheric pressure and the plasma or a reaction gas of the plasma is removed by suction through the second opening 1.2 of hollow body 1.

In another embodiment, instead of a plasma burner 3 a flame burner can be used for the internal coating of hollow body 1.

An activation process in which the plasma jet is introduced into hollow body 1 without a precursor material being supplied can take place before a coating process.

Furthermore, a first internal coating can take place directly after a production process of hollow body 1, in which hollow body 1 was formed with the supplying of heat.

In an embodiment of the invention, hollow body 1 can be held in a sample rotation device 4, so that hollow body 1 rotates around a longitudinal axis during the coating process.

Further, plasma burner 3 is made rotating around a longitudinal axis.

Preferably, an outer electrode of plasma burner 3 is formed in such a way that it can be inserted through the first opening 1.1 of hollow body 1 in the direction of the longitudinal axis of hollow body 1. The outer electrode preferably has gas outlet openings arranged in a radially symmetric manner to enable a homogeneous coating of the hollow body.

The plasma nozzle is preferably made of metal, but can also be made of other materials, such as conductive ceramics.

The coating process can comprise one or more coating passes in which the outer electrode of plasma burner 3 is inserted in hollow body 1 and moved in the longitudinal direction thereof, so that hollow body 1 is coated from the inside once or repeatedly in succession.

Hollow bodies 1 made of one of the substances: glass, plastic, metal, and ceramic, particularly glass syringe bodies, are coated from the inside. The tribological properties between the syringe body and a syringe plunger can be influenced with the deposited layer. The use of silicone oil for influencing the tribological properties is known. The wettability and thereby the distribution of the silicone oil within the syringe can be favorably influenced by the layer. Possibly the use of silicone oil can be completely omitted with a suitable coating.

A temperature of hollow body 1 in this coating process is within a range of 20° C. to 200° C., preferably at 20° C. to 120° C., especially preferably at 20° C. to 80° C.

For example, at least one oxide and/or a nitride and/or an oxynitride of at least one of the elements: silicon, titanium, aluminum, molybdenum, tungsten, vanadium, zirconium, or boron, can be deposited in the layer with use of the method. Preferably, organosilicon, organotitanium, and/or organoaluminum compounds are used as precursors for the deposition of silicon, titanium, and/or aluminum oxide layers.

Further, nanoparticles, for example, silver-containing nanoparticles and/or silver as nanoparticles can be a component of a precursor.

The precursor is preferably introduced as a gas into a working gas or into the plasma. If the precursor is liquid or solid, it is preferably transformed to the gaseous state before introduction into the working gas or into the plasma jet.

The throughput of the working gas and/or of the precursor is variable and controllable and/or adjustable. The throughputs of the working gas and precursor in particular are controllable and/or adjustable independent of one another.

Furthermore, the speed with which plasma burner 3 can be inserted into hollow body 1 and moved therein can be variable and controllable and/or adjustable.

At least one of the properties of the inner side of hollow body 1 can be changed by means of at least one of the layers deposited by the described coating process: scratch resistance, self-healing ability, reflection behavior, transmission behavior, refractive index, transparency, light scattering, electrical conductivity, friction, adhesion, hydrophilicity, hydrophobicity, oleophilicity, oleophobicity, surface tension, surface energy, anticorrosive action, dirt-repellent action, self-cleaning ability, photocatalytic behavior, antistress behavior, wear behavior, chemical resistance, biocidal behavior, biocompatible behavior, antibacterial behavior, electrostatic behavior, electrochromic activity, photochromic activity, and gasochromic activity.

Further, at least one of the deposited layers can be made as a diffusion barrier to at least one alkali element, for example, sodium or potassium, and/or to at least one alkaline earth element, for example, magnesium or calcium, and/or to boron and/or particularly to tungsten.

Furthermore, at least one of the deposited layers can function as diffusion barriers to at least one of the elements: oxygen, hydrogen, water vapor, and organic solvents, particularly from plastics.

In an embodiment of the invention, gradient layers can be applied to the inner side of hollow body 1.

A gas or aerosol, for example, air, oxygen, nitrogen, noble gases, hydrogen, carbon dioxide, gaseous hydrocarbons, ammonia, or a mixture of at least two of the aforementioned gases can be used as the working gas.

The plasma nozzle can be moved in and out in the syringe body, for example, a total of three times. In the first inward movement, no precursor is added to the plasma. Instead, only an activation of the syringe body material occurs to improve adhesion. Next, the plasma nozzle is moved inward once with a throughput of 0.4 L/min of the precursor and once with a throughput of 0.6 L/min. For example, 100 rpm is selected as the nozzle rotation speed. A rate of advance for the plasma nozzle is 50 mm/sec. Electrical power for plasma generation is about 100 W. A total gas flow is approximately 34 L/min.

Suction device 2 is optional and not absolutely necessary for the method. Hollow bodies 1 that have only the first opening and are otherwise closed can also be coated.

The method can also be used for other hollow bodies 1, particularly tubes and other continuous materials of any size, for example, for pipelines.

Particularly for the coating of tubes and other continuous material, the working gas can be introduced with the precursor into the hollow body and the plasma in the hollow body ignited by means of energy coupled into the hollow body from outside the hollow body.

The ignition of the plasma can occur, for example, by means of high-frequency excitation inductively or capacitively or by means of microwave radiation.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:
1. A method for the internal coating of a hollow body, the method comprising:
producing a plasma jet from a working gas;

supplying at least one precursor material to the working gas and/or to the plasma jet and causing said precursor material to react in the plasma jet;

introducing the plasma jet through a first opening into an interior of the hollow body; and depositing, directly after a production process of the hollow body and without an intervening activation process, at least one reaction product of at least one precursor on an inner surface of the hollow body to form a first internal coating, wherein the method is carried out at atmospheric pressure, and wherein in the production process of the hollow body, the hollow body is formed with the supplying of heat.

2. The method according to claim 1 wherein the plasma jet and/or reaction gases of the plasma jet are removed by suction through a second opening of the hollow body.

3. The method according to claim 1, wherein the hollow body is rotated around a longitudinal axis during the coating process.

4. The method according to claim 1, wherein the plasma burner emitting the plasma flow is rotated around a longitudinal axis during the coating process.

5. The method according to claim 1, wherein an outer electrode of a plasma burner emitting the plasma flow is used, which is formed in such a way that it can be inserted through the first opening in the direction of the longitudinal axis of the hollow body.

6. The method according to claim 5, wherein the outer electrode has gas outlet openings arranged in a radially symmetric configuration.

7. The method according to claim 1, wherein the plasma jet is passed through the entire hollow body by removal by suction at the second opening of the hollow body.

8. The method according to claim 1, wherein the coating process comprises one or more coating passes in which the outer electrode of the plasma burner is inserted in the hollow body and moved in the longitudinal direction thereof, so that the hollow body is coated from the inside once or repeatedly in succession.

9. The method according to claim 1, wherein the coating of a hollow body made of one of the substances: glass, plastic, metal, and ceramic.

10. The method according claim 1, wherein a glass syringe is coated as the hollow body.

11. The method according to claim 1, wherein a temperature of the hollow body is within a range of 20° C. to 200° C.

12. The method according to claim 1, wherein at least one oxide and/or a nitride and/or an oxynitride of at least one of the elements: silicon, titanium, aluminum, molybdenum, tungsten, vanadium, zirconium, or boron is deposited in the layer.

13. The method according to claim 1, wherein organosilicon, organotitanium, and/or organoaluminum compounds are used as precursors.

14. The method according to claim 1, wherein a solid, liquid, and/or gaseous precursor is used.

15. The method according to claim 1, wherein the precursor is transformed into the gaseous state before introduction into the working gas or the plasma jet.

16. The method according to claim 1, wherein silver-containing nanoparticles and/or silver as nanoparticles are a component of the precursor.

17. The method according to claim 1, wherein a throughput of the working gas and/or of the precursor is controlled and/or adjusted.

18. The method according to claim 1, wherein the speed with which the plasma burner is inserted and moved, is controlled and/or adjusted.

19. The method according to claim 1, wherein at least one of the properties of the hollow body interior side is changed by at least one of the deposited layers: scratch resistance, self-healing ability, reflection behavior, transmission behavior, refractive index, transparency, light scattering, electrical conductivity, friction, adhesion, hydrophilicity, hydrophobicity, oleophilicity, oleophobicity, surface tension, surface energy, anticorrosive action, dirt-repellent action, self-cleaning ability, photocatalytic behavior, antistress behavior, wear behavior, chemical resistance, biocidal behavior, biocompatible behavior, antibacterial behavior, electrostatic behavior, electrochromic activity, photochromic activity, or gasochromic activity.

20. The method according to claim 1, wherein at least one of the deposited layers is made as a diffusion barrier to at least one alkali element and/or at least one alkaline earth element and/or boron and/or tungsten.

21. The method according to claim 1, wherein at least one of the deposited layers is made as a diffusion barrier to at least one of the substances: oxygen, water, water vapor, carbon dioxide, and/or organic solvents, particularly from plastics.

22. The method according to claim 1, wherein a gradient layer is applied to the inner side of the hollow body.

23. The method according to claim 1, wherein a gas or an aerosol is used as the working gas.

24. The method according to claim 1, wherein one of the working gases: air, oxygen, nitrogen, noble gases, hydrogen, carbon dioxide, ammonia, gaseous hydrocarbons, or a mixture of at least two of the aforementioned gases is used.

25. The method according to claim 1, wherein a tube or a continuous material is coated as the hollow body.

26. The method according to claim 1, wherein a throughput of the working gas and the precursor are adjustable independent of one another.

27. A method for the internal coating of a hollow body, the method comprising:

introducing a plasma jet, having at least one precursor material therein, into an interior of the hollow body; and depositing, directly after a production process of the hollow body and without an intervening activation process, at least one reaction product of the at least one precursor on an inner surface of the hollow body to form a first internal coating, wherein, in the production process of the hollow body, the hollow body is formed with the supplying of heat.

* * * * *